(12) United States Patent
Chen

(10) Patent No.: US 7,310,228 B2
(45) Date of Patent: Dec. 18, 2007

(54) AIR SHROUD FOR DISSIPATING HEAT FROM AN ELECTRONIC COMPONENT

(75) Inventor: Richard Chen, San Jose, CA (US)

(73) Assignee: Super Micro Computer, Inc., San Jose, CA (US)

( * ) Notice: Subject to any disclaimer, the term of this patent is extended or adjusted under 35 U.S.C. 154(b) by 52 days.

(21) Appl. No.: 11/400,185

(22) Filed: Apr. 10, 2006

(65) Prior Publication Data

US 2007/0236882 A1   Oct. 11, 2007

(51) Int. Cl.
*H05K 7/20* (2006.01)
(52) U.S. Cl. ............... 361/695; 361/690; 361/687; 361/692; 174/16.3; 165/80.3; 165/104.33; 165/121; 165/122; 454/184
(58) Field of Classification Search ........ 361/687, 361/689, 690–697, 736, 787, 756, 796, 802, 361/803; 165/80.2, 80.3, 121–126, 104.33, 165/104.36; 312/223.2, 223.3, 265.3, 236; 454/184; 174/16.1, 16.3, 48; 257/721, 722
See application file for complete search history.

(56) References Cited

U.S. PATENT DOCUMENTS

| | | | | |
|---|---|---|---|---|
| 5,077,601 A | * | 12/1991 | Hatada et al. | 257/722 |
| 5,597,035 A | * | 1/1997 | Smith et al. | 165/80.3 |
| 5,763,950 A | * | 6/1998 | Fujisaki et al. | 257/712 |
| 5,963,424 A | * | 10/1999 | Hileman et al. | 361/695 |
| 6,678,157 B1 | * | 1/2004 | Bestwick | 361/695 |
| 6,822,863 B1 | * | 11/2004 | Artman et al. | 361/695 |
| 7,180,740 B2 | * | 2/2007 | Li et al. | 361/697 |

* cited by examiner

*Primary Examiner*—Michael Datskovskiy
(74) *Attorney, Agent, or Firm*—Troxell Law Office, PLLC

(57) ABSTRACT

A air shroud for dissipating heat from an electronic component is composed of a air shroud of a roughly U-shaped cross section, whose left and right sides are formed into a first and a second opening, respectively. A passage is formed between the first and second openings, enabling air to flow along a specific direction. A flexible thin piece is fixed inside the air shroud which covers a specific electronic component on a circuit board, and the flexible thin piece is touched with a surface of the electronic component. The fast-flowing air flows quickly along the passage, so as to effectively cool down a working temperature of the specific electronic component, thereby increasing a lifetime of usage of the specific electronic component.

8 Claims, 4 Drawing Sheets

AIR SHROUD FOR DISSIPATING HEAT FROM AN ELECTRONIC COMPONENT

BACKGROUND OF THE INVENTION a) Field of the Invention

The present invention relates to a air shroud for dissipating heat from an electronic component and more particularly to a air shroud installed in an interior of a computer case which can cover a specific electronic component on a circuit board. The air shroud is provided with an air entrance and an air exit, so as to form a passage for providing air to flow quickly, in an interior of the air shroud. A flexible thin piece is fixed in the passage, and the fast flowing air can be guided downward through the flexible thin piece, in order to enhance a heat dissipating by air to the specific electronic component.

b) Description of the Prior Art

The Taiwan Utility Patent M253826, Detachable "Air shroud without a Tool," discloses a air shroud with two openings. A suction or ventilation fan is fixed on a top of an air passage of the air shroud, such that the air can be expelled out of the two openings in an opposite direction of flow in the passage, or the air can be guided into the passage from the two openings, respectively, in an opposite direction of flow and sucked out by the fan. However, this device can only enable the air to flow in and out in the passage inside the air shroud, and is not provided with an object of dissipating heat from an electronic component with the air. In addition, there is no electronic component in the air shroud.

The Taiwan Utility Patent M245503, "Air Guiding Structure which is Easy to Install and Disengage," discloses an air guiding body which can be installed in a case for reducing a working temperature of an electronic component. However, as height of internal space of the air guiding body is a constant, if an electronic component on a circuit board is taller, the air guiding body will not be able to effectively cover and seal the electronic component in an air passage of the air guiding body. Furthermore, as a position and size of a notch installed by baffles at two sides of the air guiding body are constant, if the electronic component welded on the circuit board is larger in volume or taller in height, or the welding position is not corresponding to that of the notch, then the air guiding body will not be effectively installed and positioned on the circuit board.

The Taiwan Utility Patent M265675, "Computer Host and its Heat Dissipating Module," discloses a flow guiding casing whose interior space is a constant; therefore, it can not be effectively adapted to a heat-generating electronic component of various volume or height.

SUMMARY OF THE INVENTION

The primary object of present invention is to provide a air shroud for dissipating heat from an electronic component, wherein a flexible thin piece is fixed on an inner wall of the air shroud, and an arc-shaped surface of the flexible thin piece is deformed to a straight surface for touching with a surface of a heat-generating electronic component, thereby effectively enabling fast-flowing air to pass through peripheral surfaces of the electronic component.

Another object of the present invention is to provide a air shroud for dissipating heat from an electronic component, wherein stands at lower rims of sides of the air shroud can be quickly broken on the air shroud, so as to form a notch for enabling lower parts of two sides of the air shroud to cross over an obstacle, in order to successfully install the air shroud on a surface of circuit board in various kinds of specifications.

To enable a further understanding of the said objectives and the technological methods of the invention herein, the brief description of the drawings below is followed by the detailed description of the preferred embodiments.

DETAILED DESCRIPTION OF THE PREFERRED EMBODIMENTS

Figure 1:
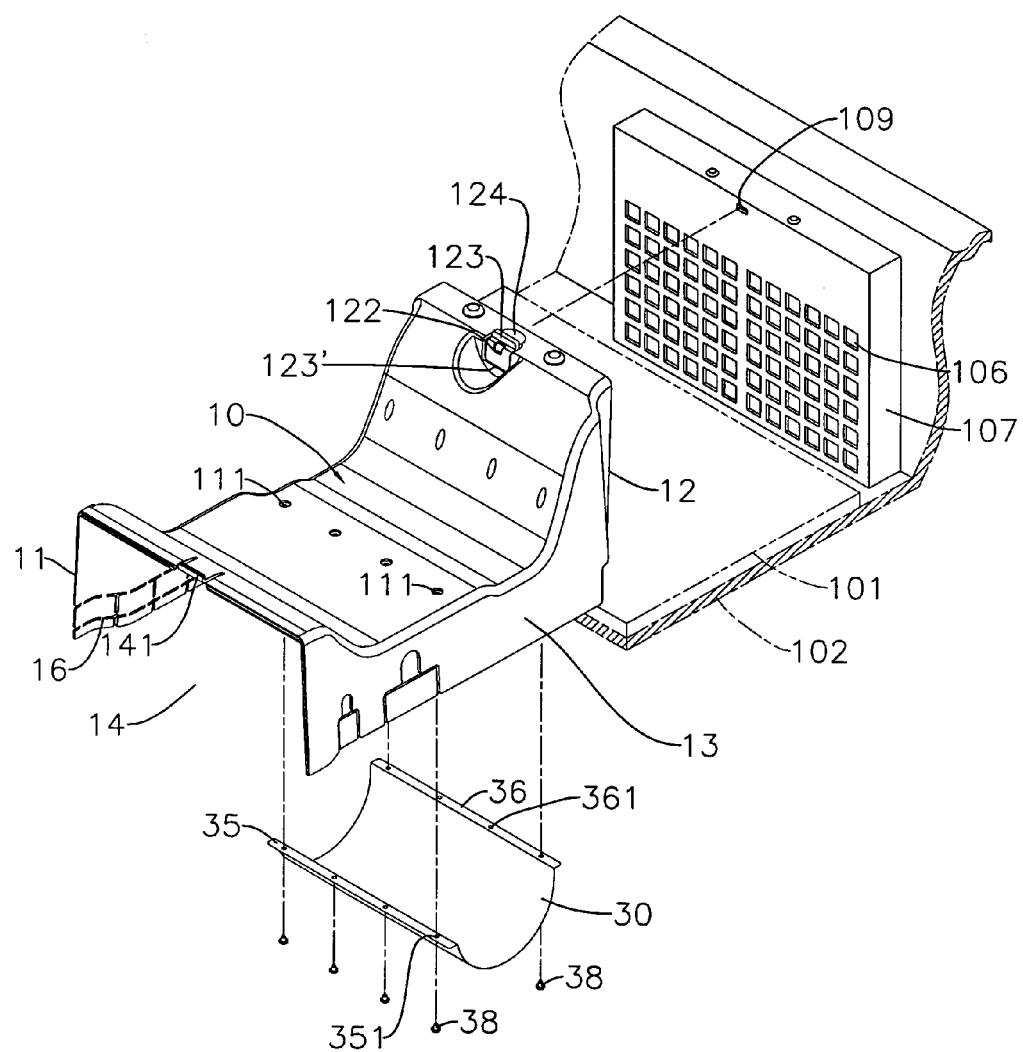
FIG. 1 shows a perspective view of a air shroud positioned on a second wall of a computer host of the present invention.
Figure 2:
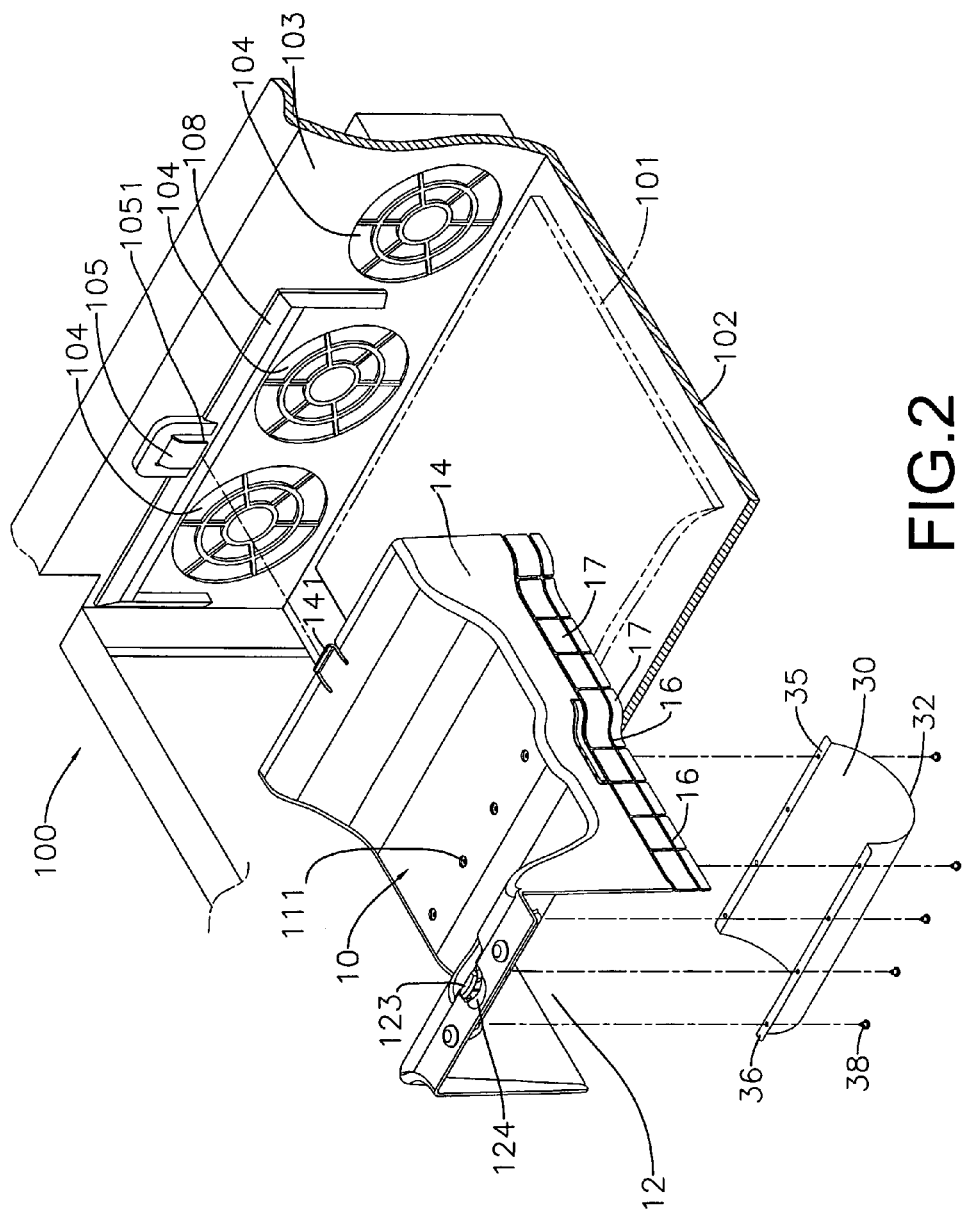
FIG. 2 shows a perspective view of a air shroud positioned on a first wall of a computer host of the present invention.
Figure 3:
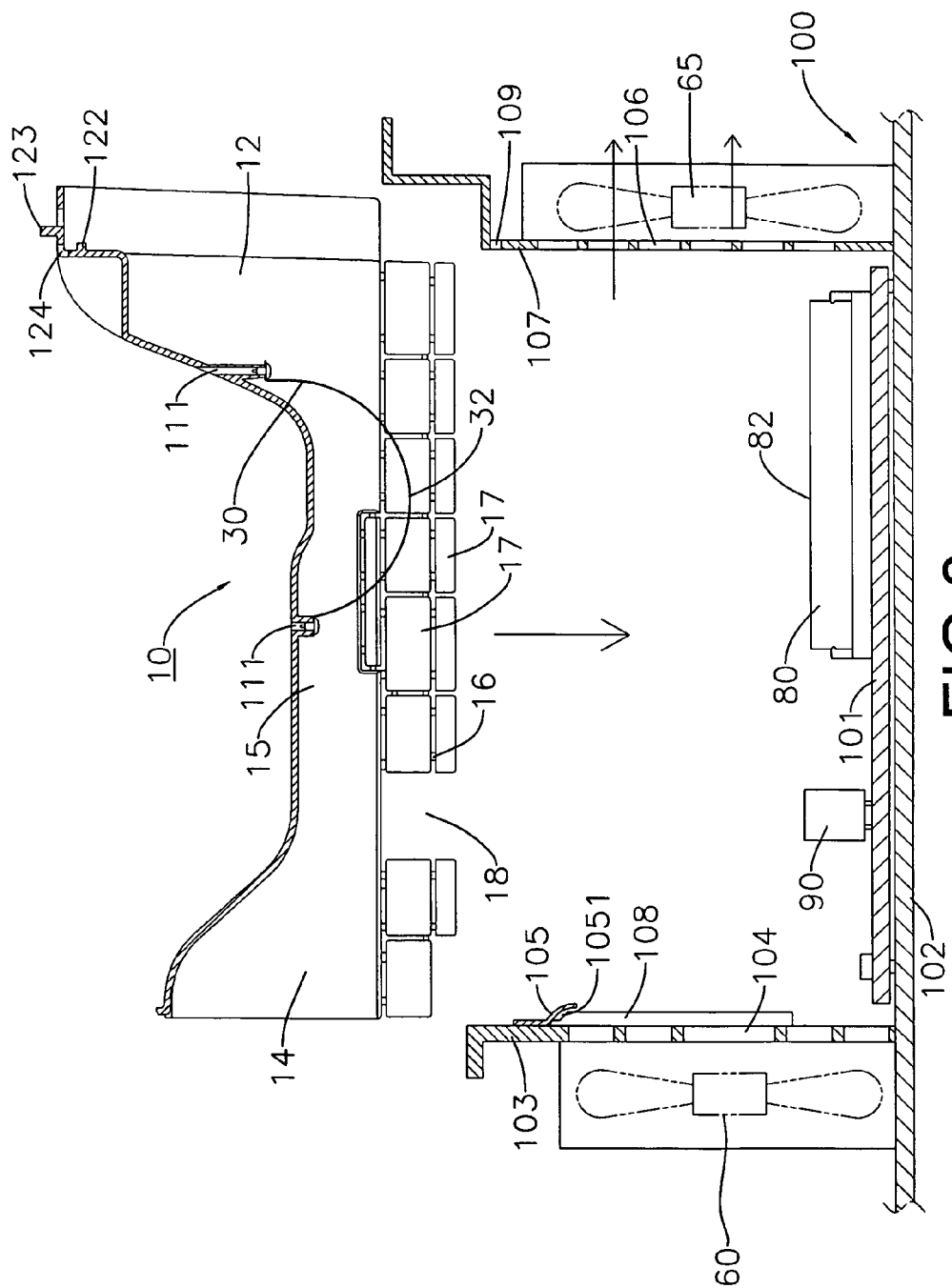
FIG. 3 shows a cross sectional view of motion of a air shroud which is about to be positioned on a first and a second walls of a computer host of the present invention.
Figure 4:
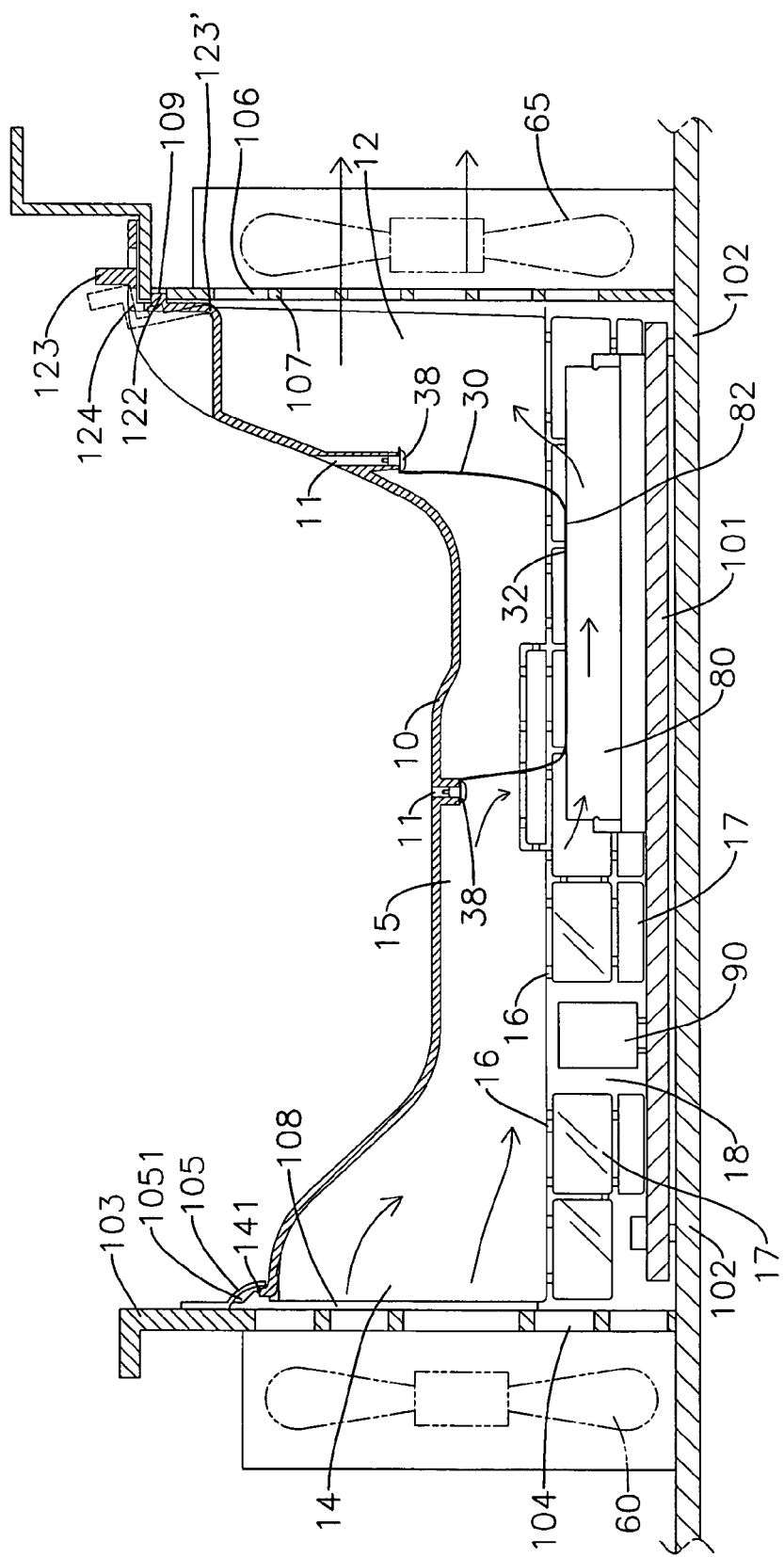
FIG. 4 shows a cross sectional view of a air shroud which has been positioned on a first and a second walls of a computer host of the present invention.

Referring to FIG. 1 and FIG. 2, the present invention is to provide a air shroud for dissipating heat from an electronic component, including a air shroud 10 of a pre-determined length and a roughly U-shaped cross section, which is provided with a first opening 12 and a second opening 14, wherein the first and second openings 12, 14 are interconnected to form a passage 15 for air flow. A modularized computer case 100 is provided with two vertical walls separated by a pre-determined distance, including a first wall 107 and a second wall 103, respectively. A circuit board 101 is installed on a base plate 102 of the computer case 100, and the air shroud 10 is covered on the circuit board 101, such that a specific electronic component 80 on the circuit board 101 can be located in the passage 15 (as shown in FIG. 3 and FIG. 4). The second opening 14 is corresponding to and connected on the second wall 103, whereas the first opening 12 is corresponding to and connected on the first wall 107. A flexible thin piece 30 having an arc-shaped surface 32 is fixed on an inner wall within the air shroud 10. The arc-shaped surface 32 can be deformed to a straight surface to be touched with a top surface 82 of the electronic component 80 (as shown in FIG. 4).

Air will be quickly flowing from the second opening 14 toward the first opening 12 in the passage 15, to blow toward the electronic component 80 below the thin piece 30, so as to effectively reduce a working temperature of the electronic component 80.

Accordingly, air openings 104 are located on the second wall 103, and a projection part 108 is located at peripheries of side edges of the air openings 104. At least more than one air hole 106 is located on a surface of the first wall 107. The second opening 14 are latched and fixed to the projection part 108 of the second wall 103, such that the second opening 14 can be corresponding to and interconnected with the air openings 104. On the other hand, the first opening 12 are latched and fixed to the first wall 107, such that the first opening 12 can be corresponding to and interconnected with the air holes 106.

Accordingly, as shown in FIG. 4, a roughly elastic hook 141 is located on the air shroud 10, at an upper edge of the second opening 14. A projection piece 105 is located on a wall surface of the second wall 103, and is provided with a latch slot 1051 at a lower part of the projection piece 105, such that the hook 141 can be latched into the latch slot 1051. An insertion hole 109 is located on a surface of the first wall 107, and a transversal and protruded insertion piece 122 is located on the air shroud 10, above the first opening 12. The insertion piece 122 is inserted into the insertion hole 109, and the air shroud 10 is firmly fixed on the first wall 103 and the second wall 107.

Accordingly, a plurality of stands 17 are connected to lower edges of a left-side wall 11 and a right-side wall 13 of the air shroud 10 by thin connectors 16, such that the stands 17 can be broken along the connectors 16 when subjected to force, to form a notch 18 which can hold an electronic component 90 protruded on a surface of circuit board 101 (as shown in FIG. 4).

Accordingly, screw holes 111 are located on an inner wall surface of the air shroud 10, and the thin piece 30 is provided with a left connection member 35 and a right connection member 36 (as shown in FIG. 1). Bolts 38 are screwed to through-holes 351, 361 of the left and right connection members 35, 36, and then screwed to the screw holes 111.

Accordingly, a size of space in a middle section of the passage 15 of the air shroud 10 is smaller than an opening space defined by the first and second openings 12, 14 (as shown in FIG. 3 and FIG. 4).

Accordingly, the fast flowing air can be selectively flowing from the first opening 12 toward the second opening 14.

Accordingly, as shown in FIG. 4, a first fan 65 is located on the first wall 107, and a second fan 60 is located on the second wall 103.

FIG. 1 and FIG. 2 show the perspective views of a air shroud 10 of present invention installed in a computer case 100 which includes a base plate 102 and a second wall 103 installed vertically on the base plate 102. A plurality of air openings 104 is located on the second wall 103, and a circuit board 101 is installed on a surface of base plate 102. A projection piece 105 is located on a wall surface of the second wall 103, and a latch slot 1051 is formed at an interior side of lower edge of the projection piece 105.

The air shroud 10 is provided with a first opening 12 and a second opening 14, between which is formed with an interconnected passage 15. A flexible soft and thin piece 30 is fixed on an inner wall surface of air shroud 10 with bolts 38, and its arc-shaped surface 32 is in a drooping status in the passage 15 due to gravitational force. An insertion piece 122 is configured on a pulling body 123 whose bottom part 123' is integrally connected on the air shroud 10 and whose other periphery is in a hollow shape 124, such that the pulling body 123 can be formed into a flexible elastic component and can be elastically shifted by some angle upon subjected to a pulling force. The transversal insertion piece 122 can be inserted into an insertion hole 109, such that the first opening 12 can be latched and fixed on a first wall 107, thereby forming a sealed condition. A space of first opening 12 is corresponding to a plurality of air holes 106, and a plurality of stands 17 can be all kinds of rectangular sheets and connected to a lower side of the air shroud 10 with connectors 16. The object is that when the stands 17 are subjected to an action of force moment of pulling and breaking, they can be broken along the connectors 16, such that one stand 17 can be separated from the air shroud 10, thereby manifesting a large or small notch 18. As shown in FIG. 3, when a plurality of irregularly protruded electronic components 90 (such as a capacitor) is welded on the circuit board 10, the notch 18 can just provide for a holding of the electronic components 90, so as to escape from all protruded obstacles upon installing the air shroud 10 on the circuit board 101.

Referring to FIG. 2, a hook 141, which is protruded upward, can be latched into the latch slot 1051, and the second opening 14 is latched into a U-shaped projection part 108, in order to tightly fit the second opening 14 into the projection part 108, such that a space of second opening 14 can be corresponding to the plurality of air openings 104. Referring to FIG. 4, the air shroud 10 of pre-determined length is fixed between the first and second walls 107, 103, wherein the electronic components 80 to be cooled down can be a plurality of pieces aligned with each other to form a memory, a chip set, or a CPU kit. When the arc-shaped surface 32 of thin piece 30 is pressed on a top surface 82 of electronic component 80, the thin piece 30 is deformed flexibly, forming a closed surface to be touched with the top surface 82, with a purpose of reducing a space of passage 15 further, thereby allowing air to flow more quickly through a gap between the electronic components 80, and having a better effect of heat dissipating for the electronic components 80. A rear surface of the second wall 103 is installed with a second fan 60, whereas a rear surface of the first wall 107 is provided with a first fan 65. The first and second fans 65, 60 can start at the same time, and the first fan 65 can be defined as a suction status (or ventilation status), whereas the second fan 60 is defined as a ventilation status (or suction status), such that air at an external of the first fan 65 can be sucked in, passed through the air openings 104, and transmitted to the passage 15. When the fast-flowing air passes through a larger space of the second opening 14, its air flow is larger and its flow speed is slower. However, as a middle space of the passage 15 is reduced (i.e., a height is getting lower), the flow speed of air passing through the middle section of the passage 15 will be increased. In addition, due to a stopping and guiding of a front surface of the arc-shaped thin piece 30, the air flow will be further accumulated to flow downward and pass through the gap between the electronic components 80 below the arc-shaped surface 32. At this time, the flow speed will be further increased due to a further narrowing of flowing space, in order to more effectively cool down peripheral surfaces of the electronic component 80, thereby enabling the electronic component 80 with a higher working temperature to be cooled down quickly. If the first fan 65 is in the ventilation status, the air which flows out of the gap between the electronic components 80 will pass through the first opening 12 and the air holes 106, and will be expelled out driven by the first fan 65. Therefore, the fast-speed air flow will be flowing quickly along the specific direction of passage 15, so as to achieve the object of effectively cooling down the electronic component 80. Moreover, as shown in FIG. 1 and FIG. 4, the pulling body 123 is pulled outward against the bottom part 123' and manifests an elastic shifting (as shown in the imaginary line in FIG. 4), enabling the transversal insertion piece 122 to be disengaged from the insertion hole 109. Then, the hook 141 is shifted downward, such that the hook 141 can be disengaged from the latch slot 1051. Therefore, the entire air shroud 10 can be quickly removed from the circuit board 101. It is worth mentioning that the first fan 65 can be also configured to the suction status, and the second fan 60 can be also set to the ventilation status; therefore, the air flow will be flowing out toward the second opening 14 along the first opening 12, which is also another implementation of the present invention.

Accordingly, the design of air shroud 10 of present invention can enable the air flow to be accumulated, and to blow quickly toward the peripheral surfaces of electronic component 80, so as to reduce the working temperature of electronic component 80 and to increase a lifetime of usage of the electronic component 80. In addition, the stands 17 can be broken quickly according to requirement, in order to form a notch 18, such that the air shroud 18 can be installed on the circuit board 101 which is provided with different specification and whose surface is distributed with irregularly concaved and protruded electronic components 90.

It is of course to be understood that the embodiments described herein is merely illustrative of the principles of the invention and that a wide variety of modifications thereto may be effected by persons skilled in the art without departing from the spirit and scope of the invention as set forth in the following claims.

What is claimed is:

1. A air shroud for dissipating heat from an electronic component comprising a air shroud of a pre-determined length and a roughly U-shaped cross section, which is provided with a first opening and a second opening interconnected to form a passage for air flow; a modularized computer case whose interior space is provided with two vertical walls separated by a pre-determined distance, including a first wall and a second wall, respectively; a circuit board being installed on a base plate of the computer case; the air shroud being covered on the circuit board, such that a specific electronic component on the circuit board can be located in the passage; the second opening being corresponding to and connected on the second wall; the first opening being corresponding to and connected on the first wall; a flexible thin piece of an arc-shaped surface being fixed on an internal wall surface inside the air shroud; the arc-shaped surface being able to be deformed to a straight surface to be touched with a top surface of the electronic component; air in the passage flowing quickly in the passage from the first opening to the second opening, to blow toward the electronic component below the thin piece, thereby effectively reducing a working temperature of the electronic component.

2. The air shroud for dissipating heat from an electronic component according to claim 1, wherein air openings and a projection part at peripheries of side edges of the air openings are located on the second wall, at least more than one air hole is located on a surface of the first wall, the second opening can be latched and fixed to the projection part of the second wall such that the second opening can be corresponding to and interconnected with the air openings, and the first opening can be latched and fixed to the first wall such that the first opening can be corresponding to and interconnected with the air holes.

3. The air shroud for dissipating heat from an electronic component according to claim 1, wherein a roughly elastic hook is located on the air shroud at an upper edge of the second opening, a projection piece is located on a wall surface of the second wall and is provided with a latch slot at a lower part of the projection piece such that the hook can be latched into the latch slot, an insertion hole is located on a surface of the first wall, and a transversal and protruded insertion piece is located on the air shroud above the first opening; the insertion piece being inserted into the insertion hole, and the air shroud being firmly fixed on the first wall and the second wall.

4. The air shroud for dissipating heat from an electronic component according to claim 1, wherein lower edges of a left side wall and a right side wall of the air shroud are connected to a plurality of stands with thin connectors respectively, and the stands can be broken along the connectors, upon being subjected to force, to form a notch which can provide for a holding of protruded electronic components on a surface of the circuit board.

5. The air shroud for dissipating heat from an electronic component according to claim 1, wherein an inner wall surface of the air shroud is provided with screw holes, the thin piece is provided with a left connection member and a right connection member, and bolts are first screwed to through-holes at the left and right connection members and then further screwed to the screw holes.

6. The air shroud for dissipating heat from an electronic component according to claim 1, wherein a volume of space at a middle section of the passage of the air shroud is smaller than an opening space defined by the first and second openings.

7. The air shroud for dissipating heat from an electronic component according to claim 1, wherein the fast-flowing air can be flowing toward the second opening from the first opening selectively.

8. The air shroud for dissipating heat from an electronic component according to claim 1, wherein the first wall is installed with a first fan and the second wall is installed with a second fan.

* * * * *